United States Patent
Lan et al.

(10) Patent No.: US 11,300,737 B2
(45) Date of Patent: Apr. 12, 2022

(54) PLUGGABLE OPTICAL TRANSCEIVER

(71) Applicant: EZCONN CORPORATION, New Taipei (TW)

(72) Inventors: Chin yin Lan, New Taipei (TW); Shih chieh Kang, New Taipei (TW)

(73) Assignee: EZconn Corporation, New Taipei (TW)

( * ) Notice: Subject to any disclaimer, the term of this patent is extended or adjusted under 35 U.S.C. 154(b) by 0 days.

(21) Appl. No.: 16/893,446

(22) Filed: Jun. 5, 2020

(65) Prior Publication Data
US 2020/0386954 A1    Dec. 10, 2020

(30) Foreign Application Priority Data
Jun. 5, 2019 (TW) ................. 108207164

(51) Int. Cl.
G02B 6/38 (2006.01)
G02B 6/42 (2006.01)
H05K 1/02 (2006.01)
H05K 1/11 (2006.01)

(52) U.S. Cl.
CPC ......... *G02B 6/3893* (2013.01); *G02B 6/3897* (2013.01); *G02B 6/428* (2013.01); *G02B 6/4246* (2013.01); *G02B 6/4261* (2013.01); *H05K 1/028* (2013.01); *H05K 1/118* (2013.01)

(58) Field of Classification Search
CPC .... G02B 6/3893; G02B 6/3897; H05K 1/028; H05K 1/118
USPC .......................................................... 385/92
See application file for complete search history.

(56) References Cited

U.S. PATENT DOCUMENTS

| | | | | |
|---|---|---|---|---|
| 4,792,203 A | * | 12/1988 | Nelson | G02B 6/24 385/134 |
| 5,076,656 A | * | 12/1991 | Briggs | G02B 6/3867 385/71 |
| 5,412,497 A | * | 5/1995 | Kaetsu | G02B 6/4471 398/164 |
| 5,521,701 A | * | 5/1996 | Felger | G01M 11/33 356/73.1 |
| 5,542,015 A | * | 7/1996 | Hultermans | G02B 6/3897 385/139 |
| 5,778,132 A | * | 7/1998 | Csipkes | H01S 3/06704 359/341.1 |
| 5,842,881 A | * | 12/1998 | Ecker | H01R 12/775 333/260 |

(Continued)

*Primary Examiner* — Kaveh C Kianni (57) ABSTRACT

A pluggable optical transceiver comprising a main body, an optical sub-assembly, an operation indicator assembly, a circuit board, a main body covering, and a rotatable locking assembly is provided. The optical sub-assembly, operation indicator assembly, and circuit board are electrically coupled and positioned within an optical fiber opening and electrical connector opening of the main body, respectively. The rotatable locking assembly is configured to release the pluggable optical transceiver from communications equipment. The operation indicator assembly has a flexible printed circuit board, at least a circuit board metalized pad, and at least a light-emitting element. The light-emitting element emits light at the optical fiber opening on an operation indicator side of the main body, for visually recognizing an operational status of the pluggable optical transceiver.

11 Claims, 4 Drawing Sheets

(56) References Cited

U.S. PATENT DOCUMENTS

| | | | | |
|---|---|---|---|---|
| 5,879,173 A * | 3/1999 | Poplawski | ......... | H01R 13/6582 |
| | | | | 439/138 |
| 6,381,394 B1 * | 4/2002 | Cabrera | ............... | H01S 3/06704 |
| | | | | 359/341.1 |
| 6,504,989 B1 * | 1/2003 | Gooding | .............. | G02B 6/4454 |
| | | | | 385/135 |
| RE38,310 E * | 11/2003 | DeMeritt | ............ | G02B 6/4453 |
| | | | | 385/14 |
| 6,846,115 B1 * | 1/2005 | Shang | .................. | G02B 6/4277 |
| | | | | 439/91 |
| 7,856,185 B2 * | 12/2010 | Hudgins | .............. | H04B 10/075 |
| | | | | 398/24 |
| 8,950,954 B2 * | 2/2015 | Wang | .................... | G02B 6/4248 |
| | | | | 385/94 |
| 9,235,014 B2 * | 1/2016 | Wang | .................... | G02B 6/423 |
| 9,570,883 B2 * | 2/2017 | Zarbock | ................ | G02B 6/4269 |
| 10,211,917 B1 * | 2/2019 | Wang | ......... | H04B 10/07953 |
| 10,578,802 B2 * | 3/2020 | Minota | .................... | G02B 6/46 |
| 10,678,073 B2 * | 6/2020 | Krasulick | ............ | G02F 1/01708 |
| 2002/0003940 A1 * | 1/2002 | Araki | ................ | G02B 6/4471 |
| | | | | 385/137 |
| 2003/0020986 A1 * | 1/2003 | Pang | .................... | G02B 6/4277 |
| | | | | 398/139 |
| 2003/0072062 A1 * | 4/2003 | Pedersen | .............. | G02B 6/4448 |
| | | | | 398/97 |
| 2003/0072063 A1 * | 4/2003 | Adams, Sr. | .......... | G02B 6/4442 |
| | | | | 398/173 |
| 2005/0169585 A1 * | 8/2005 | Aronson | ................ | H04B 10/40 |
| | | | | 385/89 |
| 2005/0201715 A1 * | 9/2005 | Ellwood | .............. | G02B 6/2746 |
| | | | | 385/147 |
| 2007/0160327 A1 * | 7/2007 | Lewallen | ............. | G02B 6/3885 |
| | | | | 385/53 |
| 2007/0173202 A1 * | 7/2007 | Binder | ............... | H04B 7/15542 |
| | | | | 455/276.1 |
| 2009/0004917 A1 * | 1/2009 | Ice | ....................... | H01R 13/648 |
| | | | | 439/607.41 |
| 2009/0060531 A1 * | 3/2009 | Biegert | ............... | H04J 14/0232 |
| | | | | 398/214 |
| 2009/0126482 A1 * | 5/2009 | Fundak | .................... | B63C 11/02 |
| | | | | 340/612 |
| 2010/0081303 A1 * | 4/2010 | Roth | ................... | G02B 6/3817 |
| | | | | 439/607.03 |
| 2011/0170858 A1 * | 7/2011 | Aguren | ................ | H04B 10/079 |
| | | | | 398/20 |
| 2011/0173315 A1 * | 7/2011 | Aguren | ................... | H04L 63/16 |
| | | | | 709/224 |
| 2011/0211798 A1 * | 9/2011 | Chen | .................... | G02B 6/4448 |
| | | | | 29/592.1 |
| 2011/0221601 A1 * | 9/2011 | Aguren | ................ | G02B 6/3895 |
| | | | | 340/653 |
| 2011/0268452 A1 * | 11/2011 | Beamon | ........... | H04B 10/25758 |
| | | | | 398/116 |
| 2011/0274437 A1 * | 11/2011 | Jones | ................... | G02B 6/3879 |
| | | | | 398/141 |
| 2012/0155803 A1 * | 6/2012 | Benjamin | ............ | G02B 6/4204 |
| | | | | 385/33 |
| 2012/0281952 A1 * | 11/2012 | McColloch | .......... | G02B 6/4284 |
| | | | | 385/92 |
| 2014/0056592 A1 * | 2/2014 | McColloch | ............ | H04B 10/40 |
| | | | | 29/428 |
| 2014/0340487 A1 * | 11/2014 | Gilliland | .............. | H04N 13/167 |
| | | | | 348/48 |
| 2015/0104177 A1 * | 4/2015 | Kato | .................... | G02B 6/4213 |
| | | | | 398/79 |
| 2015/0147036 A1 * | 5/2015 | Isenhour | ............... | G02B 6/3833 |
| | | | | 29/862 |
| 2016/0103286 A1 * | 4/2016 | Matsui | .................... | H04B 10/40 |
| | | | | 398/139 |
| 2017/0110782 A1 * | 4/2017 | Iwasaki | .................... | H01Q 1/38 |
| 2017/0261674 A1 * | 9/2017 | Henry | ................... | G02B 6/0006 |
| 2018/0149814 A1 * | 5/2018 | Minota | ................ | G02B 6/4457 |

* cited by examiner

PLUGGABLE OPTICAL TRANSCEIVER

RELATED APPLICATIONS

The application claims the benefit of priority to Taiwan application no. 108207164, filed on Jun. 5, 2019, of which is incorporated herein by reference in its entirety.

TECHNICAL FIELD

Example embodiments relate generally to the field of optical communications and, more particularly, to pluggable optical transceivers.

BACKGROUND

Growing demand for higher performance and speed has led to the widespread use of optical fibres in communications, such as for hyperscale, colocation and on-premise data centers. In optical communication systems, light sends data to a remote end via an optical fibre in the form of pulses of light instead of electrical current. Communications equipment, however, such as routers, switches, firewalls, and wireless access points, receives or transmits data via electrical current.

A fibre optic transceiver is a key component in optical communication systems, converting optical signals to electrical signals and vice versa. Fibre optic transceivers may be classified by fibre mode, transfer rate, transmission distance, wavelength, and connector type. One connector type transceiver is a small form-factor pluggable (SFP) transceiver. SFP optical transceivers are compliant with the SFP Multi-source Agreement (MSA) and can be installed into SFP MSA compliant ports at any time without the interruption of the host equipment operating online. SFP optical transceivers are available in different wavelengths for gigabit ethernet/fibre channel, high speed I/O for file server, mass storage system I/O and host adapter I/O, SONET OC-3/SDH STM-1, and fast ethernet applications.

With a large number of third part SFP optical transceivers on the market, in addition to brand name and the different types of SFP optical transceivers available, compatibility is often the biggest concern for technician during installation, maintenance and repair. Which type of fibre optic cable is the SFP optical transceiver connecting to, what is the transmission data rate, what is the distance of the link, what type of signals are being transmitted etc., are all questions which must be answered for good connections. Nonetheless, slow traffic or no data transmission occur if an SFP optical transceiver is inserted into an SFP+ transceiver switch port or vice versa, if the wavelength of one of the SFP optical transceivers does not support the wavelength of the SFP optical transceiver at the other end of data transmission, if the fibre type, i.e. single- or multi-mode fibre type of one of the SFP optical transceivers is different from the SFP optical transceiver at the other end of data transmission, if a device switch port at one end of one of the SFP optical transceivers is not compatible therewith, etc.

With new data centers being built and existing data centers being upgraded the problem of poor communications equipment access and cable management during installation, maintenance and repair have increased. Often, there are multiple adapters and cable segments connected in a data center, with access to connectors used required not just when deployed, but, several times during deployment. Identifying and trouble-shooting slow traffic or no data transmission due to SFP optical transceiver compatibility may be time-consuming and increase the risk of human error. Further, densely packed connections may exacerbate the problems and result in damaged communications equipment or devices.

SUMMARY

In an embodiment, a pluggable optical transceiver comprising a main body, an optical sub-assembly, an operation indicator assembly, a circuit board, and a main body covering is provided. The main body has a U-shaped longitudinal chamber defining an electrical connector opening, a central enclosure, and an optical fiber opening, opposite the electrical connector opening. The optical sub-assembly is positioned within the U-shaped longitudinal chamber near to the optical fiber opening, and has at least an electrical interconnect. The operation indicator assembly is positioned within the U-shaped longitudinal chamber near to the optical fiber opening. The operation indicator assembly has a flexible printed circuit board, at least a circuit board metalized pad on a second circuit board end of the flexible printed circuit board, and at least a light-emitting element, electrically coupled to the at least a circuit board metalized pad, on an operation indictor end of the flexible printed circuit board, opposite the second circuit board end. The circuit board is positioned within the U-shaped longitudinal chamber near to the electrical connector opening. The circuit board has at least a connector metalized pad on an electrical connector end thereof, at the electrical connector opening, at least a first internal metalized pad, electrically coupled to the at least an electrical interconnect of the optical sub-assembly, on an indicator end thereof, opposite the electrical connector end, and at least a second internal metalized pad positioned next to the at least a first internal metalized pad, electrically coupled to the at least a circuit board metalized pad of the operation indicator assembly. The at least a first internal metalized pad and at least a second internal metalized pad are electrically coupled to the at least a connector metalized pad. The main body covering is assembled to the main body, enclosing the central enclosure. The operation indicator assembly outputs light emitted from the at least a light-emitting element for visually recognizing an operational status of the pluggable optical transceiver.

In some embodiments, the at least a light-emitting element is positioned at the optical fiber opening on an operation indicator side of the main body. In some embodiments, the pluggable optical transceiver further comprises a U-shaped covering fixedly assembled to the pluggable optical transceiver, encompassing the optical sub-assembly positioned within the U-shaped longitudinal chamber, whereby the U-shaped covering covers the flexible printed circuit board. In some of the embodiments, the amount of the at least a light-emitting element is one, whereby light of different colors is emitted. In some of the embodiments, the amount of the at least a light-emitting element is two or greater, and each emit light of different colors.

In some embodiments, the main body further comprises a support structure, and at least a conical tunnel having a light source end and an operation indicator end, opposite the light source end, both positioned next to the optical sub-assembly on the operation indicator side of the main body, wherein the operation indicator end is positioned at the optical fiber opening and the light source end is positioned next to the support structure and light emitted from the at least a light-emitting element is output from the light source end for visually recognizing an operational status of the pluggable optical transceiver at the operation indicator end. In some embodiments, the amount of the at least a conical tunnel is one, whereby light of different colors is emitted at the operation indicator end, corresponding to the at least a light-emitting element at the light source end. In some embodiments, the amount of the at least a conical tunnel is two or greater, and each emit light of different colors at the operation indicator end, corresponding to the at least a light-emitting element at the light source end.

In an embodiment, a pluggable optical transceiver comprising a main body, an optical sub-assembly, an operation indicator assembly, a circuit board, and a main body covering is provided. The main body has a U-shaped longitudinal chamber defining an electrical connector opening, a central enclosure, and an optical fiber opening, opposite the electrical connector opening, a support structure, and at least a conical tunnel having a light source end and an operation indicator end, opposite the light source end, both positioned next to the optical sub-assembly on an operation indicator side of the main body. The operation indicator end is positioned at the optical fiber opening and the light source end is positioned next to the support structure. The optical sub-assembly is positioned within the U-shaped longitudinal chamber near to the optical fiber opening. The optical sub-assembly has at least an electrical interconnect. The operation indicator assembly is positioned within the U-shaped longitudinal chamber near to the optical fiber opening. The operation indicator assembly has a flexible printed circuit board, at least a circuit board metalized pad on a second circuit board end of the flexible printed circuit board, and at least a light-emitting element, electrically coupled to the at least a circuit board metalized pad, on an operation indictor end of the flexible printed circuit board, opposite the second circuit board end. The circuit board is positioned within the U-shaped longitudinal chamber near to the electrical connector opening. The circuit board has at least a connector metalized pad on an electrical connector end thereof, at the electrical connector opening, at least a first internal metalized pad, electrically coupled to the at least an electrical interconnect of the optical sub-assembly, on an indicator end thereof, opposite the electrical connector end, and at least a second internal metalized pad positioned next to the at least a first internal metalized pad, electrically coupled to the at least a circuit board metalized pad of the operation indicator assembly. The at least a first internal metalized pad and at least a second internal metalized pad are electrically coupled to the at least a connector metalized pad. The main body covering is assembled to the main body, enclosing the central enclosure. The operation indicator assembly outputs light emitted from the at least a light-emitting element from the light source end for visually recognizing an operational status of the pluggable optical transceiver at the operation indicator end.

In some embodiments, the pluggable optical transceiver further comprises at least a light pipe corresponding to and fittingly positioned in the at least a conical tunnel, made from an optically transparent polycarbonate material. The light pipe facilitates the output of light emitted from the at least a light-emitting element from the light source end for visually recognizing an operational status of the pluggable optical transceiver at the operation indicator end.

In some embodiments, the pluggable optical transceiver further comprises a rotatable locking assembly having a slide release latch, assembled at the optical fiber opening, configured to release the pluggable optical transceiver from communications equipment. When the main body covering is coupled to the main body, the slide release latch protrudes though a latch through hole of a slide release mechanism of the main body covering at an angle. When releasing the pluggable optical transceiver from communications equipment, the slide release latch is rotated to longitudinally move the slide release mechanism toward the electrical connector opening, detaching the pluggable optical transceiver from the communications equipment.

In some embodiments, the optical sub-assembly is a bi-directional optical sub-assembly, in some alternative embodiments, the optical sub-assembly is a transmitter optical sub-assembly, and in further alternative embodiments, the optical sub-assembly is a receiver optical sub-assembly.

BRIEF DESCRIPTION OF THE DRAWINGS

Unless specified otherwise, the accompanying drawings illustrate aspects of the innovative subject matter described herein. Referring to the drawings, wherein like reference numerals indicate similar parts throughout the several views, several examples of heatsink fins incorporating aspects of the presently disclosed principles are illustrated by way of example, and not by way of limitation.

DETAILED DESCRIPTION

The following describes various principles related to optical communication systems by way of reference to specific examples of the pluggable optical transceivers, including arrangements and examples of optical sub-assemblies, operation indicator assemblies, and circuit boards embodying innovative concepts. More particularly, but not exclusively, such innovative principles are described in relation to selected examples of optical sub-assemblies, operation indicator assemblies, and circuit boards and well-known functions or constructions are be described in detail for purposes of succinctness and clarity. Nonetheless, one or more of the disclosed principles can be incorporated in various other embodiments of the pluggable optical transceivers to achieve any of a variety of desired outcomes, characteristics, and/or performance criteria.

Thus, optical sub-assemblies, operation indicator assemblies, and circuit boards having attributes that are different from those specific examples discussed herein can embody one or more of the innovative principles, and can be used in applications not described herein in detail. Accordingly, embodiments of optical sub-assemblies, operation indicator assemblies, and circuit boards not described herein in detail also fall within the scope of this disclosure, as will be appreciated by those having ordinary skill in the relevant art following a review of this disclosure.

Example embodiments as disclosed herein are directed to pluggable optical transceivers. In an embodiment, a pluggable optical transceiver comprising a main body, an optical sub-assembly, an operation indicator assembly, a circuit board, a main body covering, and a rotatable locking assembly is provided. The optical sub-assembly, operation indicator assembly, and circuit board are electrically coupled and positioned within an optical fiber opening and electrical connector opening of the main body, respectively. The rotatable locking assembly is configured to release the pluggable optical transceiver from communications equipment. The operation indicator assembly has a flexible printed circuit board, at least a circuit board metalized pad, and at least a light-emitting element. The light-emitting element emits light at the optical fiber opening on an operation indicator side of the main body, for visually recognizing an operational status of the pluggable optical transceiver.

Figure 1A:
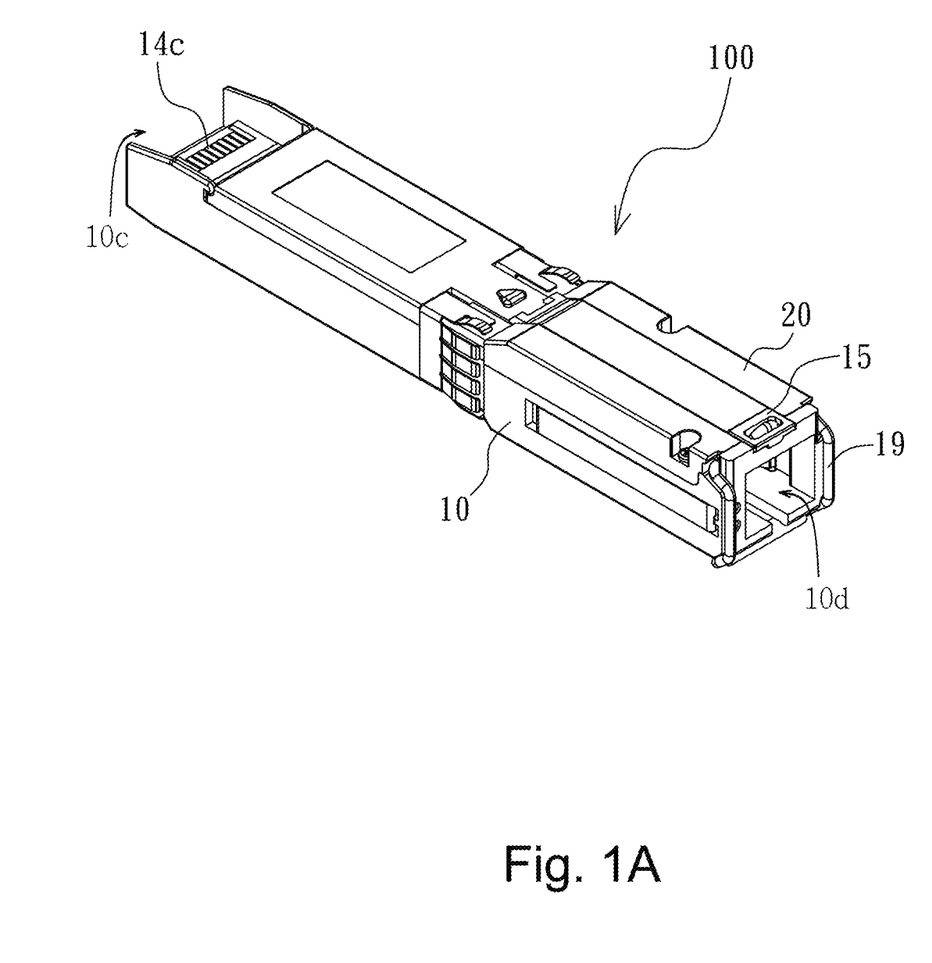
FIG. 1A is a schematic perspective view of a pluggable optical transceiver, according to an example embodiment.
Figure 1B:
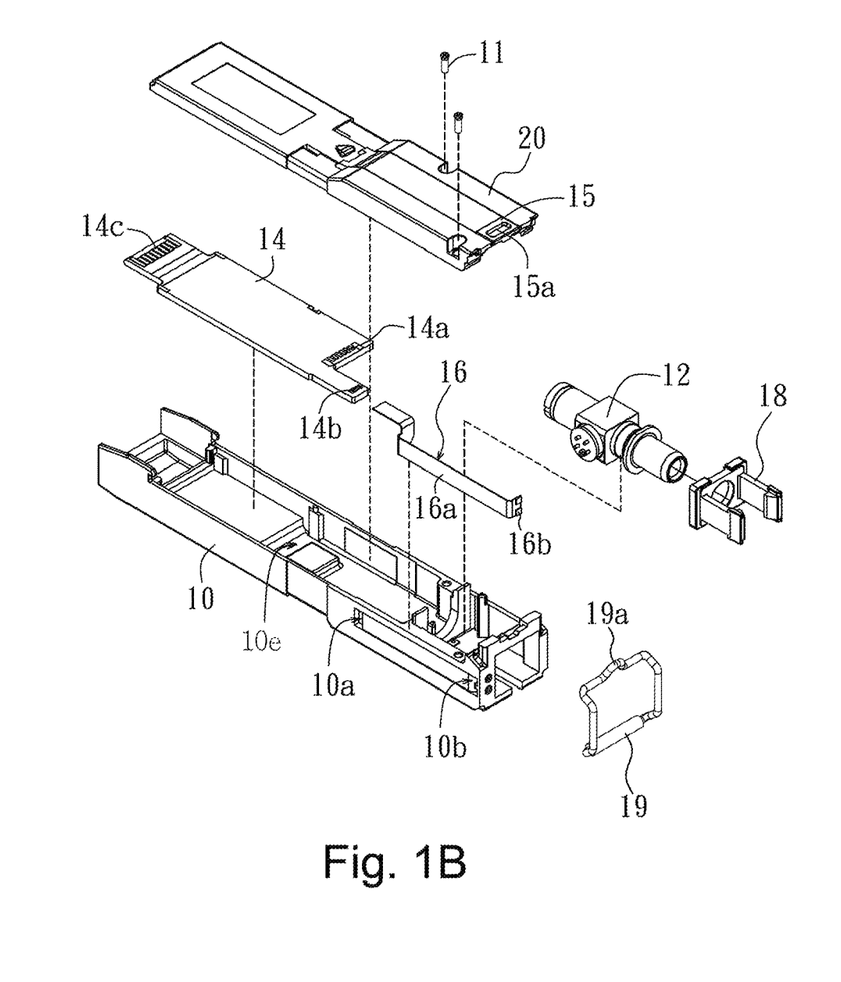
FIG. 1B is a schematic exploded view of the pluggable optical transceiver of FIG. 1A, according to an example embodiment.
Figure 1C:
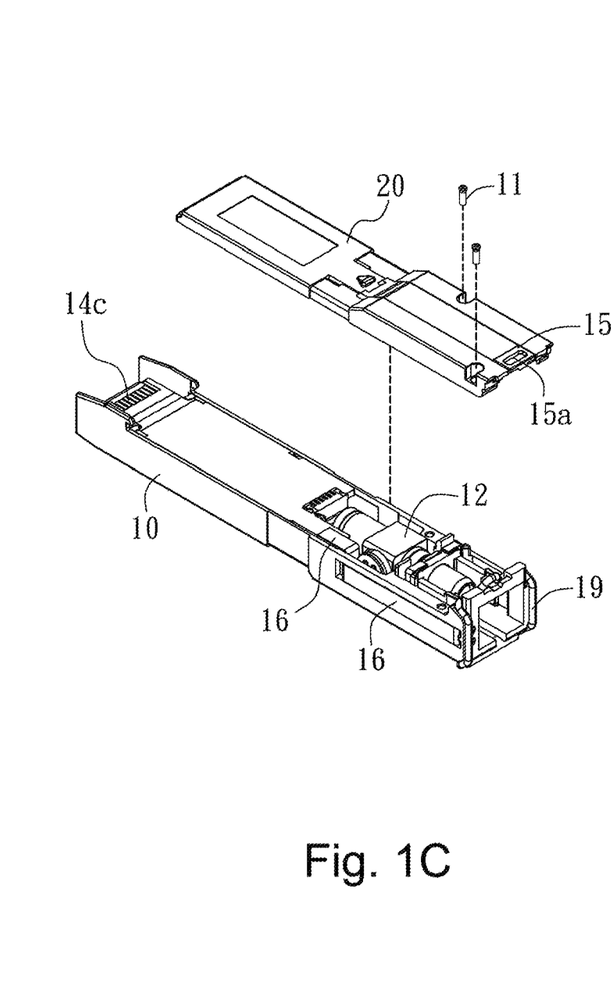
FIG. 1C is a schematic partial exploded view of the pluggable optical transceiver of FIG. 1A, according to an example embodiment.

In some embodiments, the pluggable optical transceivers may be applicable, as an example and not to be limiting, to communications equipment, panels, chassis' or racks, providing physical connection to networks and devices. FIG. 1A is a schematic perspective view of a pluggable optical transceiver, according to an example embodiment. FIG. 1B is a schematic exploded view of the pluggable optical transceiver of FIG. 1A, according to an example embodiment. FIG. 1C is a schematic partial exploded view of the pluggable optical transceiver of FIG. 1A, according to an example embodiment. Referring to FIGS. 1A to 1C, in an embodiment, a pluggable optical transceiver 100 comprising a main body 10, an optical sub-assembly 12, an operation indicator assembly 16, a circuit board 14, and a main body covering 20 is provided. The main body 10 has a U-shaped longitudinal chamber defining an electrical connector opening 10c, a central enclosure 10e, and an optical fiber opening 10d, opposite the electrical connector opening 10c. The optical sub-assembly 12 is positioned within the U-shaped longitudinal chamber near to the optical fiber opening 10d, and has at least an electrical interconnect (not shown). The operation indicator assembly 16 is positioned within the U-shaped longitudinal chamber near to the optical fiber opening 10d. The operation indicator assembly 16 has a flexible printed circuit board 16a, at least a circuit board metalized pad on a second circuit board end of the flexible printed circuit board 16a, and at least a light-emitting element 16b, electrically coupled to the at least a circuit board metalized pad, on an operation indictor end of the flexible printed circuit board 16a, opposite the second circuit board end. The circuit board 14 is positioned within the U-shaped longitudinal chamber near to the electrical connector opening 10c. The circuit board 14 has at least a connector metalized pad 14c on an electrical connector end thereof, at the electrical connector opening 10c, at least a first internal metalized pad 14a, electrically coupled to the at least an electrical interconnect of the optical sub-assembly 12, on an indicator end thereof, opposite the electrical connector end, and at least a second internal metalized pad 14b positioned next to the at least a first internal metalized pad 14a, electrically coupled to the at least a circuit board metalized pad of the operation indicator assembly 16. The at least a first internal metalized pad 14a and at least a second internal metalized pad 14b are electrically coupled to the at least a connector metalized pad 14c. The main body covering 20 is assembled to the main body 10, enclosing the central enclosure 10e. The operation indicator assembly 16 outputs light emitted from the at least a light-emitting element 16b for visually recognizing an operational status of the pluggable optical transceiver 100.

In some embodiments, the at least a light-emitting element 16b is positioned at the optical fiber opening 10d on an operation indicator side of the main body 10. In some embodiments, the main body 10 further comprises a first indentation 10a, a second indentation 10b, and at least an operation indicator through hole on the operation indicator side thereof. A portion of the flexible printed circuit board 16a next to the second circuit board end is positioned through the first indentation 10a and the at least a light-emitting element 16b on an operation indictor end of the flexible printed circuit board 16a is positioned through the second indentation 10b, such that each of the at least a light-emitting element 16b corresponds to each of the at least an operation indicator through hole.

In some embodiments, the pluggable optical transceiver 100 further comprises a U-shaped covering fixedly assembled to the pluggable optical transceiver 100, encompassing the optical sub-assembly 12 positioned within the U-shaped longitudinal chamber, whereby the U-shaped covering covers the flexible printed circuit board 16a. The U-shaped covering may be fixedly assembled to the pluggable optical transceiver 100 in any suitable manner known to those having ordinary skill in the relevant art, such as via snap fitting. In some of the embodiments, the amount of the at least a light-emitting element 16b is one, whereby light of different colors is emitted. In some of the embodiments, the amount of the at least a light-emitting element 16b is two or greater, and each emit light of different colors.

Figure 2A:
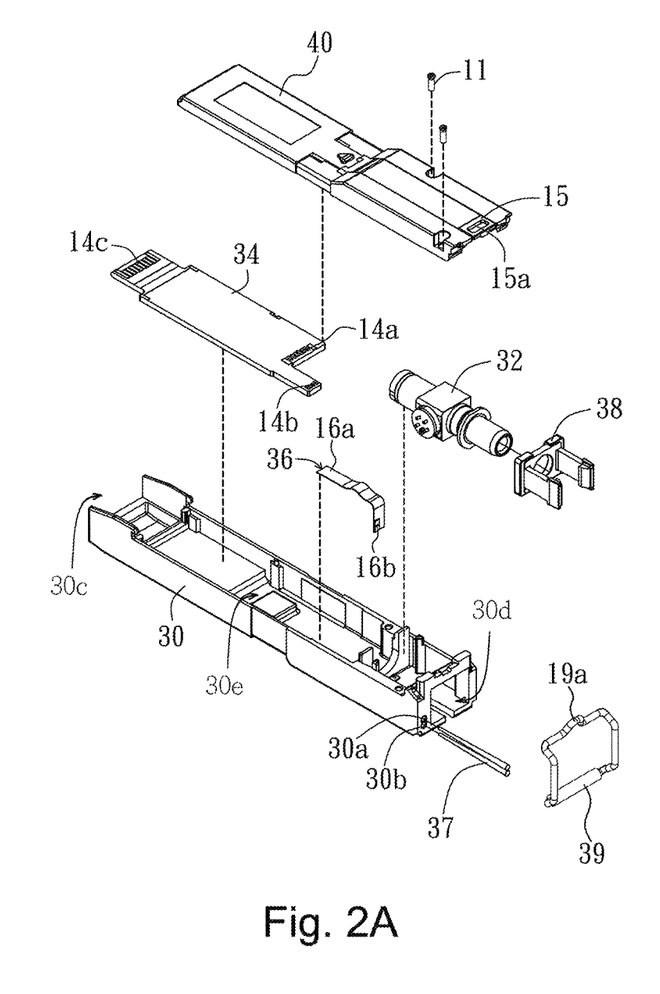
FIG. 2A is a schematic exploded view of an alternative optical transceiver, according to an example embodiment.
Figure 2B:
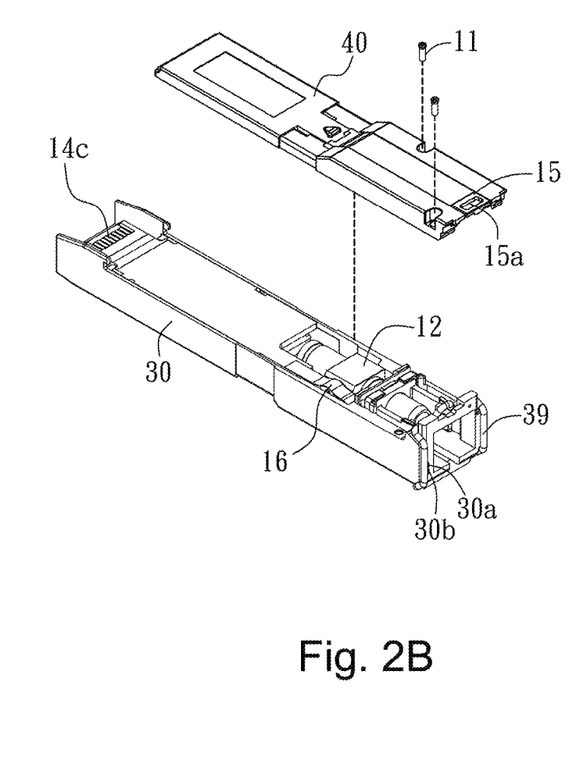
FIG. 2B is a schematic partial exploded view of the alternative optical transceiver of FIG. 2A, according to an example embodiment.
Figure 2C:
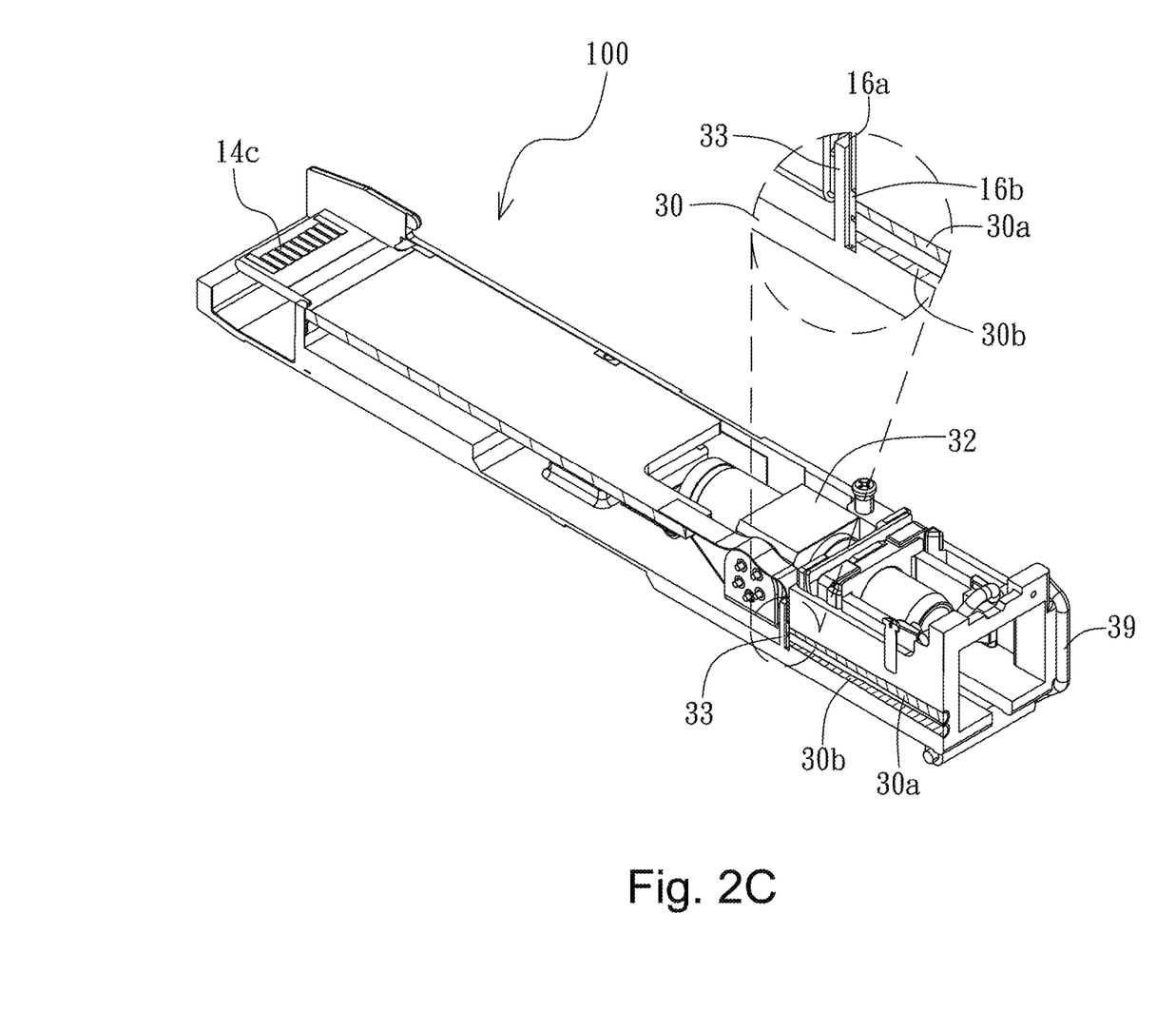
FIG. 2C is a schematic cross-sectional view of the alternative optical transceiver of FIG. 2A, according to an example embodiment.

In some embodiments, the at least a light-emitting element 16b is positioned at the optical fiber opening 10d on the operation indicator side of the main body for visually recognizing an operational status of the pluggable optical transceiver 100; however, the embodiments are not limited thereto. In some embodiments, the at least a light-emitting element 16b is not positioned at the optical fiber opening 10d for visually recognizing an operational status of the pluggable optical transceiver 100. FIG. 2A is a schematic exploded view of an alternative optical transceiver, according to an example embodiment. FIG. 2B is a schematic partial exploded view of the alternative optical transceiver of FIG. 2A, according to an example embodiment. FIG. 2C is a schematic cross-sectional view of the alternative optical transceiver of FIG. 2A, according to an example embodiment. Referring to FIGS. 2A to 2C, in an alternative embodiment, the main body further comprises a support structure 33, and at least a conical tunnel 30a, 30b having a light source end and an operation indicator end, opposite the light source end, both positioned next to the optical sub-assembly 32 on the operation indicator side of the main body 30, wherein the operation indicator end is positioned at the optical fiber opening 30d and the light source end is positioned next to the support structure 33 and light emitted from the at least a light-emitting element 16b is output from the light source end for visually recognizing an operational status of the pluggable optical transceiver 100 at the operation indicator end. In some embodiments, the amount of the at least a conical tunnel is one, whereby light of different colors is emitted at the operation indicator end, corresponding to the at least a light-emitting element at the light source end. In some embodiments, the amount of the at least a conical tunnel 30a, 30b is two or greater, and each emit light of different colors at the operation indicator end, corresponding to the at least a light-emitting element 16b at the light source end.

In another alternative embodiment, a pluggable optical transceiver 100 comprising a main body 30, an optical sub-assembly 32, an operation indicator assembly 36, a circuit board 34, and a main body covering 40 is provided. The main body 30 has a U-shaped longitudinal chamber defining an electrical connector opening 30c, a central enclosure 30e, and an optical fiber opening 30d, opposite the electrical connector opening 30c, a support structure 33, and at least a conical tunnel 30a, 30b having a light source end and an operation indicator end, opposite the light source end, both positioned next to the optical sub-assembly 32 on an operation indicator side of the main body 30. The operation indicator end is positioned at the optical fiber opening 30d and the light source end is positioned next to the support structure 33. The optical sub-assembly 32 is positioned within the U-shaped longitudinal chamber near to the optical fiber opening 30d. The optical sub-assembly 32 has at least an electrical interconnect. The operation indicator assembly 36 is positioned within the U-shaped longitudinal chamber near to the optical fiber opening 30d. The operation indicator assembly 36 has a flexible printed circuit board 34, at least a circuit board metalized pad on a second circuit board end of the flexible printed circuit board 34, and at least a light-emitting element 16b, electrically coupled to the at least a circuit board metalized pad, on an operation indictor end of the flexible printed circuit board 34, opposite the second circuit board end. The circuit board 34 is positioned within the U-shaped longitudinal chamber near to the electrical connector opening 30c. The circuit board 34 has at least a connector metalized pad 14c on an electrical connector end thereof, at the electrical connector opening 30c, at least a first internal metalized pad 14a, electrically coupled to the at least an electrical interconnect of the optical sub-assembly 12, on an indicator end thereof, opposite the electrical connector end, and at least a second internal metalized pad 14b positioned next to the at least a first internal metalized pad 14a, electrically coupled to the at least a circuit board metalized pad of the operation indicator assembly 36. The at least a first internal metalized pad 14a and at least a second internal metalized pad 14b are electrically coupled to the at least a connector metalized pad 14c. The main body covering 40 is assembled to the main body 30, enclosing the central enclosure 30e. The operation indicator assembly 36 outputs light emitted from the at least a light-emitting element 16b from the light source end for visually recognizing an operational status of the pluggable optical transceiver 100 at the operation indicator end.

In some embodiments, the diameter of the at least a conical tunnel 30a, 30b is between 1 mm to 10 mm; however the embodiments are limited thereto. In alternative embodiments, the diameter may be between 1 mm to 10 mm or any suitable diameter known to those of ordinary skill in the relevant art. As long as an operational status of the pluggable optical transceiver 100 at the operation indicator end may be visually recognized by the output of light emitted from the at least a light-emitting element 16b from the light source end.

In some embodiments, the pluggable optical transceiver 100 further comprises at least a light pipe 37, 37 corresponding to and fittingly positioned in the at least a conical tunnel 30a, 30b, made from an optically transparent polycarbonate material. The at least a light pipe 37, 37 facilitates the output of light emitted from the at least a light-emitting element from the light source end for visually recognizing an operational status of the pluggable optical transceiver at the operation indicator end.

In some embodiments, a portion of the flexible printed circuit board 16a next to the second circuit board end is positioned over a portion of the optical sub-assembly 32 and the at least a light-emitting element 16b on an operation indictor end of the flexible printed circuit board 16a is positioned next to the support structure 33, such that each of the at least a light-emitting element 16b corresponds to each of the at least a conical tunnel 30a, 30b. Each of the at least a light-emitting element 16b emits light at the light source end of the at least a conical tunnel 30a, 30b, whereby the light travels through the at least a conical tunnel 30a, 30b and/or at least a light pipe 37, 37 for visually recognizing an operational status of the pluggable optical transceiver 100 at the operation indicator end of the at least a conical tunnel 30a, 30b at the optical fiber opening 30d of the main body 30.

In some embodiments, the pluggable optical transceiver 100 further comprises a rotatable locking assembly 19, 39 having a slide release latch 19a, 19a, assembled at the optical fiber opening 10d, 30d, configured to release an optical connector to and from the optical fiber opening 10d, 30d of the main body 10, 30. When the main body covering 20, 40 is coupled to the main body 10, 30, the slide release latch 19a, 19a protrudes though a latch through hole 15a, 15a of a slide release mechanism 15, 15 of the main body covering 20, 40 at an angle. When releasing the pluggable optical transceiver 100 from communications equipment, the slide release latch 19a, 19a is rotated to longitudinally move the slide release mechanism 15, 15 toward the electrical connector opening 10c, 30c, detaching the pluggable optical transceiver 100 from the communications equipment.

In some embodiments, the pluggable optical transceiver 100 further comprises a stabilizer 18, 38 secured to an optical end of the optical sub-assembly 12, 12, opposite the first circuit board end. The stabilizer 18, 38 surrounds the optical end and secures positioning of the optical sub-assembly 12, 12 within the U-shaped longitudinal chamber near to the optical fiber opening 10d, 30d.

In some embodiments, when assembling the pluggable optical transceiver 100, the circuit board 14, 34, operation indicator assembly 16, 36, and optical sub-assembly 12, 32 having the stabilizer 18, 38 secured thereto, are securely positioned within the U-shaped longitudinal chamber and/or between the electrical connector opening 10c, 30c and optical fiber opening 10d, 30d of the main body 10, 30. At this time, the operation indicator assembly 16, 36 and optical sub-assembly 12, 32 are electrically coupled to the circuit board 14, 34, respectively. Next, the main body covering 20, 40 is fixedly secured to the main body 10, 30, encasing the circuit board 14, 34, operation indicator assembly 16, 36, and optical sub-assembly 12, 32 having the stabilizer 18, 38 secured thereto. In some embodiments, at least a screw component 11, 11 is used to screw the main body covering 20, 40 to the main body 10, 30. Note that in the alternative embodiment, the at least a light pipe 37, 37 may be inserted into the at least a conical tunnel 30a, 30b, at this time. Following, in some embodiments, the rotatable locking assembly 19, 39 having a slide release latch 19a, 19a, is assembled at the optical fiber opening 10d, 30d, coupling the main body covering 20, 40 to the main body 10, 30. When the main body covering 20, 40 is coupled to the main body 10, 30, the slide release latch 19a, 19a protrudes though the latch through hole 15a, 15a of the slide release mechanism 15, 15 of the main body covering 20, 40 at an angle. When disassembling the pluggable optical transceiver 100, the previous process may be reversed.

In some embodiments, the pluggable optical transceiver 100 is detached from communications equipment, via rotation of the slide release latch 19a, 19a to longitudinally move the slide release mechanism 15, 15 toward the electrical connector opening 10c, 30c. Detachment of the pluggable optical transceiver 100 from the communications equipment, is via longitudinal movement of the slide release mechanism 15, 15 pressing against an engaging portion of the main body covering 20, 40 configured to unhinge the pluggable optical transceiver 100 from the communications equipment.

In some embodiments, the pluggable optical transceiver 100 is a small form-factor pluggable (SFP) transceiver; however, the embodiments are not limited thereto. Those having ordinary skill in the relevant art may readily appreciate that the pluggable optical transceiver 100 may comprise other types of the pluggable optical transceivers, whereby the footprint of the standard pluggable optical transceiver type is not changed.

In some embodiments, the optical sub-assembly 12 is a bi-directional optical sub-assembly (BOSA) 12, in some alternative embodiments, the optical sub-assembly 12 is a transmitter optical sub-assembly (TOSA) 12, and in further alternative embodiments, the optical sub-assembly 12 is a receiver optical sub-assembly (ROSA) 12.

In some embodiments, the material of the main body 10, 30 and main body covering 20, 40 is metal or metal alloy comprising iron, zinc, steel, aluminum, or copper, as examples.

In some embodiments, the pluggable optical transceiver 100 comprises a flexible printed circuit board 16a, 34; however, the embodiments are not limited thereto. In alternative embodiments, the pluggable optical transceiver 100 may comprise a conductive wire (not shown), as long as the conductive wire may be electrically coupled to the at least a second internal metalized pad 14b and at least a light-emitting element 16b.

In some embodiments, the at least a light-emitting element 16b is a light-emitting diode; however, the embodiments are not limited thereto. In alternative embodiment, the at least a light-emitting element 16b may be any suitable light-emitting element known by those having ordinary skill in the relevant art. As long as the at least a light-emitting element 16b emits light of different colors, such as red, green, yellow, or blue, as examples. In some embodiments, the at least a light-emitting element 16b may emit one color. In alternative embodiments, the at least a light-emitting element 16b may emit more than one color. In some embodiments, the pluggable optical transceiver 100 is configured, such that each at least a light-emitting element 16b colors, represent different operational statuses. As an example, and not to be limiting, the color green may represent a normal standby operating status, the color red may represent an abnormal operating status, and the color blue may represent a normal operating status, whereby signals are being transmitted.

With new data centers being built and existing data centers being upgraded the problem of poor communications equipment access and cable management during installation, maintenance and repair have increased. Often, there are multiple adapters and cable segments connected in a data center, with access to connectors used required not just when deployed, but, several times during deployment. Identifying and trouble-shooting slow traffic or no data transmission due to SFP optical transceiver compatibility is time-consuming and increases the risk of human error. Densely packed connections exacerbate the problems and may result in damaged communications equipment or devices.

In the embodiments, pluggable optical transceivers comprising a main body, an optical sub-assembly, an operation indicator assembly, a circuit board, a main body covering, and a rotatable locking assembly are provided. The optical sub-assembly, operation indicator assembly, and circuit board are electrically coupled and positioned within an optical fiber opening and electrical connector opening of the main body, respectively. The rotatable locking assembly is configured to release the pluggable optical transceiver from communications equipment. The operation indicator assembly has a flexible printed circuit board, at least a circuit board metalized pad, and at least a light-emitting element. The light-emitting element emits light at the optical fiber opening on an operation indicator side of the main body, for visually recognizing an operational status of the pluggable optical transceiver.

The embodiments of the pluggable optical transceivers provide visual recognition of an operational status thereof via at least a light-emitting element, while keeping its standard pluggable optical transceiver footprint. The at least a light-emitting element emits light at the optical fiber opening, on an operation indicator side of the main body. The pluggable optical transceivers may be configured to emit light of different colors, representing different operational statuses. A green light may represent a normal standby operating status, a red light may represent an abnormal operating status, and a blue light may represent a normal operating status, whereby signals are being transmitted. Thus, time is saved and risk of human error is decreased when identifying and trouble-shooting slow traffic or no data transmission due to SFP optical transceiver compatibility; especially for densely packed connections, whereby the possibility of damage of communications equipment or devices is decreased.

The presently disclosed inventive concepts are not intended to be limited to the embodiments shown herein, but are to be accorded their full scope consistent with the principles underlying the disclosed concepts herein. Directions and references to an element, such as "up," "down,", "upper," "lower," "horizontal," "vertical," "left," "right," and the like, do not imply absolute relationships, positions, and/or orientations. Terms of an element, such as "first" and "second" are not literal, but, distinguishing terms. As used herein, terms "comprises" or "comprising" encompass the notions of "including" and "having" and specify the presence of elements, operations, and/or groups or combinations thereof and do not imply preclusion of the presence or addition of one or more other elements, operations and/or groups or combinations thereof. Sequence of operations do not imply absoluteness unless specifically so stated. Reference to an element in the singular, such as by use of the article "a" or "an", is not intended to mean "one and only one" unless specifically so stated, but rather "one or more". As used herein, "and/or" means "and" or "or", as well as "and" and "or." As used herein, ranges and subranges mean all ranges including whole and/or fractional values therein and language which defines or modifies ranges and subranges, such as "at least," "greater than," "less than," "no more than," and the like, mean subranges and/or an upper or lower limit. All structural and functional equivalents to the elements of the various embodiments described throughout the disclosure that are known or later come to be known to those of ordinary skill in the relevant art are intended to be encompassed by the features described and claimed herein. Moreover, nothing disclosed herein is intended to be dedicated to the public regardless of whether such disclosure may ultimately explicitly be recited in the claims. No element or concept disclosed herein or hereafter presented shall be construed under the provisions of 35 USC 112(f) unless the element or concept is expressly recited using the phrase "means for" or "step for".

In view of the many possible embodiments to which the disclosed principles can be applied, we reserve the right to claim any and all combinations of features and acts described herein, including the right to claim all that comes within the scope and spirit of the foregoing description, as well as the combinations recited, literally and equivalently, in the following claims and any claims presented anytime throughout prosecution of this application or any application claiming benefit of or priority from this application.

What is claimed is:

1. A pluggable optical transceiver, comprising:
a main body having a U-shaped longitudinal chamber defining an electrical connector opening, a central enclosure, and an optical fiber opening, opposite the electrical connector opening, a support structure, and at least a conical tunnel having a light source end and an operation indicator end, opposite the light source end, wherein the operation indicator end is positioned at the optical fiber opening and the light source end is positioned next to the support structure;
at least a light pipe corresponding to and fittingly positioned in the at least a conical tunnel;
an optical sub-assembly positioned within the U-shaped longitudinal chamber near to the optical fiber opening, having at least an electrical interconnect;
an operation indicator assembly positioned within the U-shaped longitudinal chamber near to the optical fiber opening, having a flexible printed circuit board, at least a circuit board metalized pad on a second circuit board end of the flexible printed circuit board, and at least a light-emitting element, electrically coupled to the at least a circuit board metalized pad, on an operation indicator end of the flexible printed circuit board, opposite the second circuit board end;
a circuit board positioned within the U-shaped longitudinal chamber near to the electrical connector opening, having at least a connector metalized pad on an electrical connector end thereof, at the electrical connector opening, at least a first internal metalized pad, electrically coupled to the at least an electrical interconnect of the optical sub-assembly, on an indicator end thereof, opposite the electrical connector end, and at least a second internal metalized pad positioned next to the at least a first internal metalized pad, electrically coupled to the at least a circuit board metalized pad of the operation indicator assembly, wherein the at least a first internal metalized pad and at least a second internal metalized pad are electrically coupled to the at least a connector metalized pad; and
a main body covering assembled to the main body, enclosing the central enclosure,
wherein the operation indicator assembly outputs light emitted from the at least a light-emitting element from the light source end for visually recognizing an operational status of the pluggable optical transceiver at the operation indicator end
whereby the output of light emitted from the at least a light-emitting element from the light source end is facilitated by the at least a light pipe.

2. The pluggable optical transceiver of claim 1, wherein the optical sub-assembly is a bi-directional optical sub-assembly.

3. The pluggable optical transceiver of claim 1, wherein the optical sub-assembly is a transmitter optical sub-assembly.

4. The pluggable optical transceiver of claim 1, wherein the optical sub-assembly is a receiver optical sub-assembly.

5. The pluggable optical transceiver of claim 1, wherein the amount of the at least a conical tunnel is two or greater, and each emit light of different colors at the operation indicator end, corresponding to the at least a light-emitting element at the light source end.

6. The pluggable optical transceiver of claim 5, wherein the amount of the at least a light-emitting element is two or greater, and each emit light of different colors.

7. The pluggable optical transceiver of claim 1, further comprising a rotatable locking assembly having a slide release latch, assembled at the optical fiber opening, configured to release the pluggable optical transceiver from communications equipment, wherein when the main body covering is coupled to the main body, the slide release latch protrudes though a latch through hole of a slide release mechanism of the main body covering at an angle, and when releasing the pluggable optical transceiver from communications equipment, the slide release latch is rotated to longitudinally move the slide release mechanism toward the electrical connector opening, detaching the pluggable optical transceiver from the communications equipment.

8. The pluggable optical transceiver of claim 1, wherein the at least a conical tunnel is positioned next to the optical sub-assembly on an operation indicator side of the main body.

9. The pluggable optical transceiver of claim 1, wherein the at least a light pipe comprises an optically transparent polycarbonate material.

10. The pluggable optical transceiver of claim 1, wherein the amount of the at least a conical tunnel is one, whereby light of different colors is emitted at the operation indicator end, corresponding to the at least a light-emitting element at the light source end.

11. The pluggable optical transceiver of claim 10, wherein the amount of the at least a light-emitting element is one, whereby light of different colors is emitted.

* * * * *